United States Patent
Chen et al.

(10) Patent No.: US 10,802,395 B2
(45) Date of Patent: Oct. 13, 2020

(54) LITHOGRAPHIC MASK, A PELLICLE THEREIN AND METHOD OF FORMING THE SAME

(71) Applicant: TAIWAN SEMICONDUCTOR MANUFACTURING COMPANY LTD., Hsinchu (TW)

(72) Inventors: Ching-Yueh Chen, Hsinchu County (TW); Tzung-Shiun Liu, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 210 days.

(21) Appl. No.: 16/135,414

(22) Filed: Sep. 19, 2018

(65) Prior Publication Data
US 2020/0089102 A1    Mar. 19, 2020

(51) Int. Cl.
G03F 1/64    (2012.01)
H01L 21/027    (2006.01)
G03F 1/80    (2012.01)
G03F 7/20    (2006.01)

(52) U.S. Cl.
CPC .......... *G03F 1/64* (2013.01); *G03F 1/80* (2013.01); *G03F 7/70983* (2013.01); *H01L 21/0274* (2013.01)

(58) Field of Classification Search
CPC ..... G03F 1/64; G03F 1/80; G03F 1/62; H01L 21/0274
See application file for complete search history.

(56) References Cited

U.S. PATENT DOCUMENTS

| | | | |
|---|---|---|---|
| 2008/0002168 A1* | 1/2008 | Boom | G03F 7/70808 355/53 |
| 2008/0124633 A1* | 5/2008 | Nagai | G03F 7/70191 430/5 |
| 2009/0059189 A1* | 3/2009 | Goehnermeier | G03F 1/62 355/30 |
| 2014/0147773 A1* | 5/2014 | Takebe | G03F 1/142 430/5 |

* cited by examiner

*Primary Examiner* — Stewart A Fraser
(74) *Attorney, Agent, or Firm* — WPAT, P.C., Intellectual Property Attorneys; Anthony King (57) ABSTRACT

The present disclosure provides a mask for photolithography patterning. The mask includes a substrate, a pattern layer on a surface of the substrate. The mask also includes a pellicle attached to the substrate and configured to isolate the pattern layer from ambient. The pellicle includes a membrane between the pattern layer and ambient, and an optical member disposed in the membrane. A method for manufacturing the mask is also provided.

20 Claims, 9 Drawing Sheets

LITHOGRAPHIC MASK, A PELLICLE THEREIN AND METHOD OF FORMING THE SAME

BACKGROUND

Photolithography is an operation that is used to create small structures, such as integrated circuits and micromachines, on a semiconductor wafer or the like. Photolithography entails exposing a radiation-sensitive substance, called photoresist, to a pattern of light or other radiation. The pattern is typically created by passing the radiation through a mask, which is composed of a substrate with a pattern on its surface. The mask, which may be transmissive or reflective, determines the pattern to be transferred to the photoresist as a result of the exposure followed by a develop operation.

To accurately produce the desired exposure pattern, a newly fabricated mask is locally treated before it can be used. However, the mask local treatments, such as mask repair process or Zeiss critical dimension control (CDC), inevitably lead to permanent and irreversible damage to the mask. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
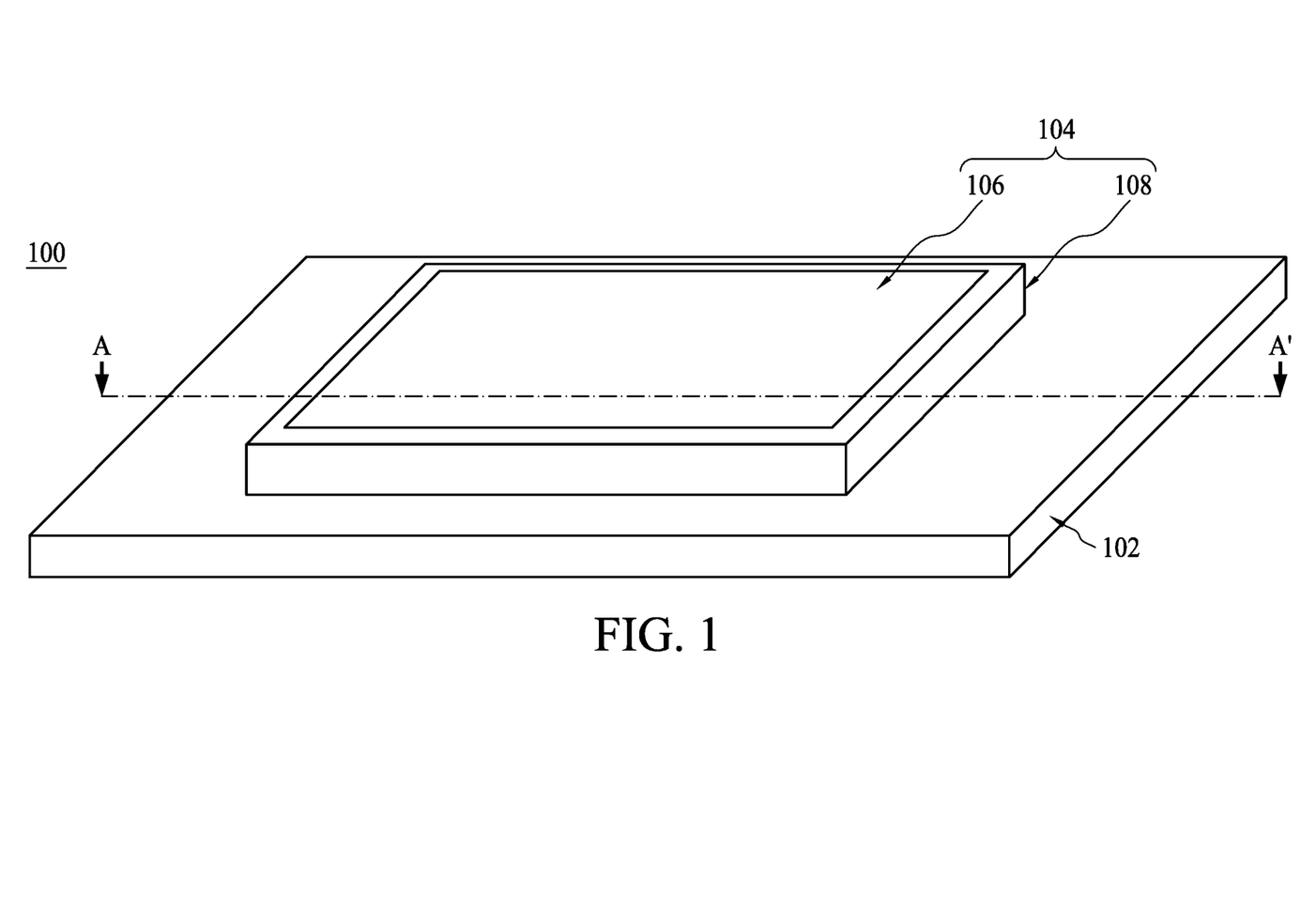
FIG. 1 is a schematic view of a mask in accordance with some embodiments of the present disclosure.

Referring to FIG. 1, FIG. 1 is a schematic view of a mask 100 in accordance with some embodiments of the present disclosure.

The mask 100 includes a substrate 102 and a pellicle 104 attached to the substrate 102. The pellicle 104 includes a membrane 106 and a frame 108, collectively referred as the pellicle 104. The frame 108 secures the membrane 106 on the substrate 102. The membrane 106 is a thin film that is mounted over the frame 108.

In some embodiments, the substrate 102 is transmissive to a radiation with a predetermined wavelength. The term "transmissive" in this application refers to sufficient transmission of light so that photoresist material can be patterned on a semiconductor wafer in accordance with the mask 100. For example, in some embodiments, the substrate 102 is transmissive to a deep ultraviolet (DUV) radiation having a wavelength about 193 nm or 248 nm. In some embodiments, the substrate 102 is reflective to an extreme ultraviolet (EUV) radiation having a wavelength about 13.5 nm. The terms "radiation" in this application is used in a general sense to also include radiation other than visible light.

In some embodiments, the substrate 102 includes a low thermal expansion material (LTEM) substrate. The LTEM substrate may include LTEM glass, quartz, silicon, silicon carbide, black diamond, and/or other suitable material known in the art. The LTEM substrate serves to minimize image distortion by mask heating.

In some embodiments, the membrane 106 is a film or layer which is transmissive to a radiation with a predetermined wavelength. For example, the membrane 106 is transmissive to a DUV radiation having a wavelength about 193 nm or 248 nm. Alternatively, the membrane 106 is transmissive to a EUV radiation having a wavelength about 13.5 nm.

The membrane 106 can be a variety of sizes depending upon application parameters. For example, the membrane 106 may have a diameter of 120 mm, 150 mm, or even 300 mm or more. Application parameters and semiconductor tool requirements can affect the required dimensions for the membrane 106. The membrane 106 is shown as a rectangular-shaped pellicle, although any shape appropriate for semiconductor or integrated circuit (IC) fabrication equipment is possible, such as a square shape.

In some embodiments, the membrane 106 has a thickness about 0.1-2.0 micron (μm). The thickness of membrane 106 is preferably chosen for transparency at a particular wavelength. For example, the thickness is chosen to maximize transmission.

In some embodiments, the membrane 106 is thin enough to allow sufficient amount of light transmission and yet thick enough to have sufficient stability. Membrane materials are typically thin polymer films that do not appreciably change the optical projection and that do not contribute to pattern misplacement and other imaging aberrations. The membrane materials should also be inexpensive enough to be cost effective. In some embodiments, the membrane 106 can be manufactured from nitrocellulose. Other pellicle membrane materials include polymers, such as, fluoropolymers or cellulose acetate.

In some embodiments, the membrane 106 includes silicon, poly-silicon, amorphous silicon, or other suitable material. In some embodiments, the membrane 106 is made of a material having a low absorption coefficient of EUV radiation. The absorption coefficient determines how far a particular wavelength can penetrate into a material before it is absorbed. In a material with a low absorption coefficient, light is only poorly absorbed, and if the material is thin enough, it will appear transparent to that wavelength.

In some embodiments, silicon is relatively transparent at EUV wavelengths and is robust and stable enough to withstand multiple exposures to such radiation. In addition, silicon and amorphous silicon has been proven to have a low absorption coefficient of EUV radiation.

In some embodiments, the pellicle 104 also includes an antireflective coating (ARC) provided on the membrane 106. The ARC can be variety of materials including calcium fluoride (CaF).

In some embodiments, the frame 108 includes a material with mechanical strength and designed in a shape, dimensions, and a configuration such that to secure the pellicle 104 properly. For example, the frame 108 includes aluminum (Al). The frame 108 may include one piece or two components as illustrated. The frame 108 may be designed in various dimensions, shapes and configurations.

The mask 100 may be utilized in a photolithography operation of a semiconductor wafer. The pellicle 104 protects the mask 100 from fallen particles and keeps the particles out of focus so that they do not produce an image, which may cause defects when the mask 100 is being used.

Figure 2A:
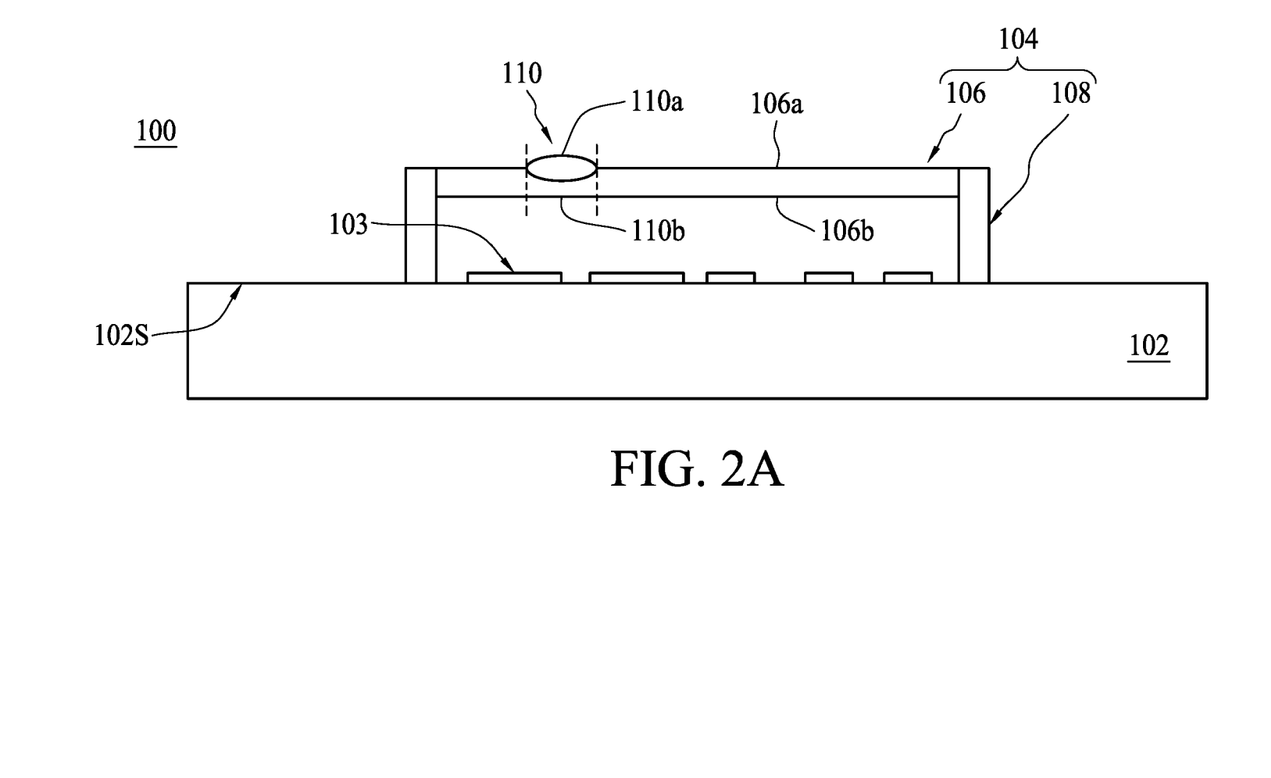
FIG. 2A to FIG. 2C are cross section views along line AA' of FIG. 1 in accordance with some embodiments of the present disclosure.
Figure 2B:
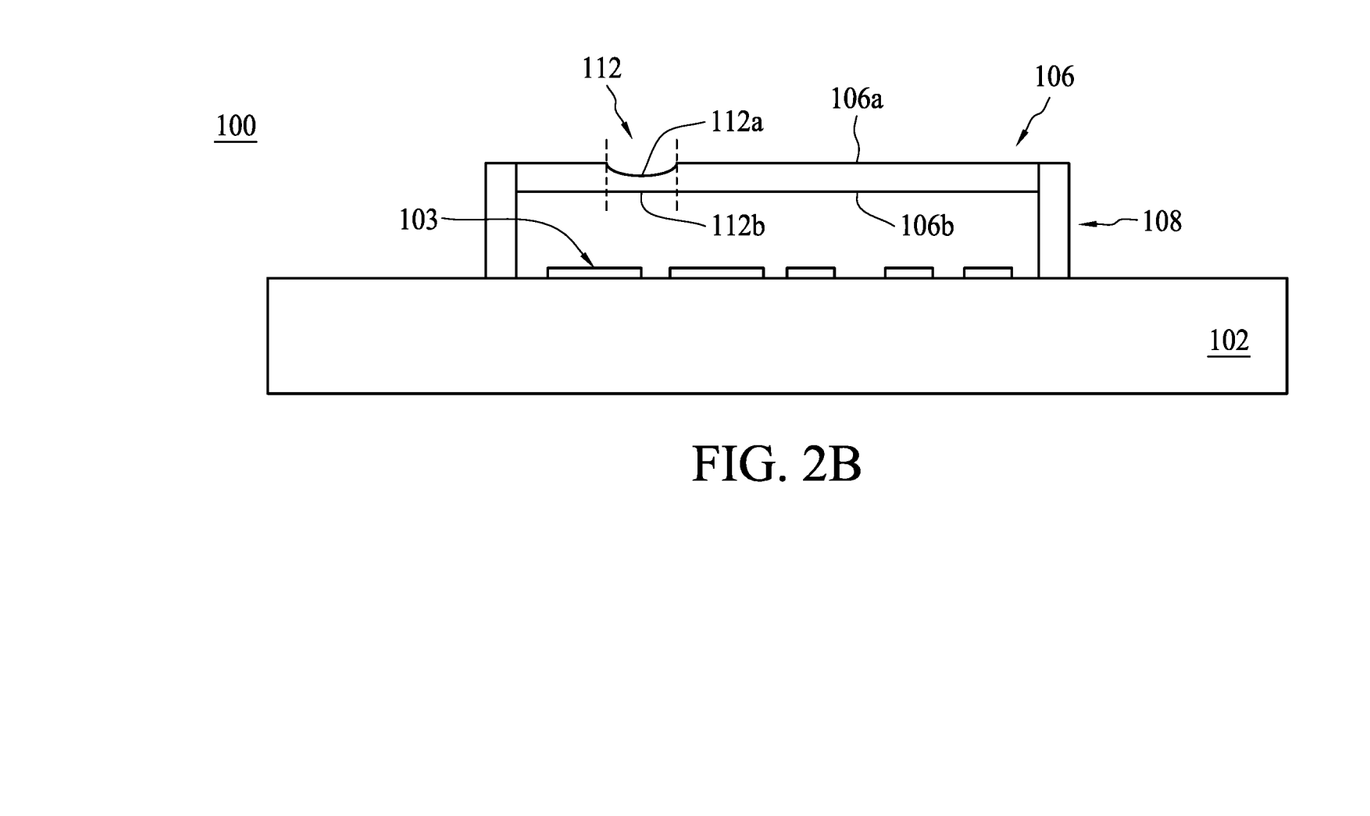
Figure 2C:
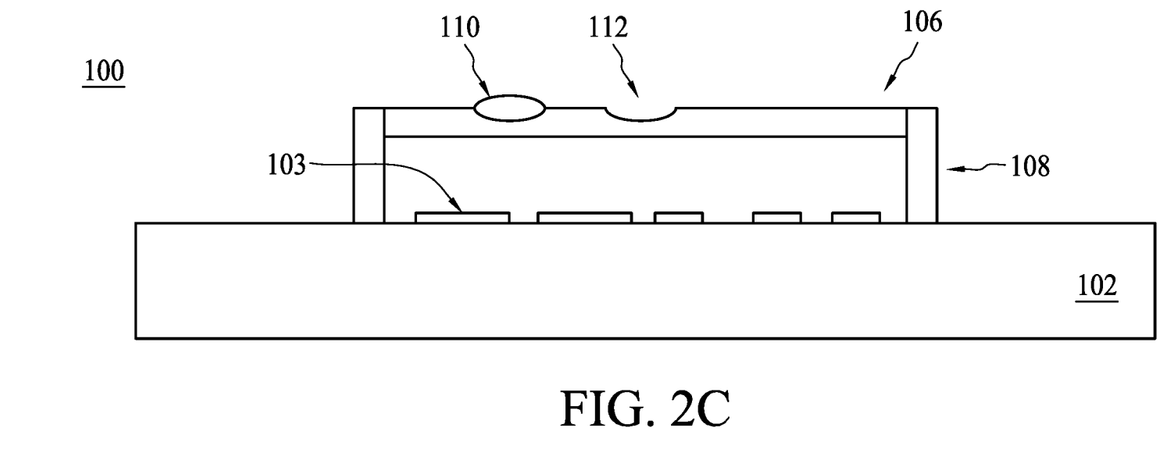

Referring to FIG. 2A to FIG. 2C, FIG. 2A to FIG. 2C are cross section views along line AA' of FIG. 1 in accordance with some embodiments of the present disclosure.

As shown in FIG. 2A, the mask 100 further includes a pattern layer 103 on a surface 102S of the substrate 102. The membrane 106 is between the pattern layer 103 and ambient. The membrane 106 isolates the pattern layer 103 from ambient. The membrane 106 has a surface 106a faces against the pattern layer 103, and a surface 106b faces toward the pattern layer 103.

In some embodiments, the pattern layer 103 formed on the surface 102S may include features (or absorbers), designed to attenuate and/or provide a phase shift to a radiation used in the photolithography operation. In some embodiments, the mask 100 may be a binary mask (BIM), a super binary mask (SMIM), or a phase shift mask (PSM), which includes an alternative phase shift mask (alt. PSM) or an attenuated phase shift mask (att. PSM).

In some embodiments, the pattern layer 103 includes metal silicide (such as MoSi or $TaSi_2$), metal nitride (such as TiN, ZrN, NbN, MoN, CrN, or TaN), metal oxide (such as $MoO_3$, $Cr_2O_3$, $TiO_2$, $Nb_2O_5$, or $Ta_2O_5$), other materials such as Cr, Mo, Ti, Ta, $SiO_2$, $Si_3N_4$, $Al_2O_3N$, $Al_2O_3R$, or combinations thereof.

In some embodiments, there are multiple layers on the substrate 102, which are collectively referred as the pattern layer 103 in the present application. For example, the multiple layers include a reflective multilayer, a capping layer, an absorption layer, an antireflection (ARC) layer, and/or a buffer layer.

Take a mask used in a EUV photolithography operation for example; the pattern layer 103 of the mask 100 includes a reflective multilayer disposed over the substrate 102. The reflective multilayer includes alternating layers of materials having a high refractive index and a low refractive index. A material having a high refractive index has a tendency to scatter EUV radiation and on other hand, a material having a low refractive index has a tendency to transmit EUV radiation. The pattern layer 103 may include film pairs such as molybdenum-silicon (Mo/Si) film pairs (e.g., a layer of molybdenum above or below a layer of silicon in each film pair), or any material that is highly reflective at EUV wavelengths can be utilized for the pattern layer 103.

A capping layer is optionally formed on the reflective multilayer to prevent oxidation of the multilayer and acting as an etch stop layer during following processes. In some embodiment, the capping layer includes a thickness about 20-80 nm. In some embodiment, the capping layer includes ruthenium (Ru), silicon dioxide ($SiO_2$), amorphous carbon or other suitable compositions. A low temperature deposition process is often chosen for the capping layer to prevent interdiffusion of the reflective multilayer.

An absorption layer is optionally formed on the capping layer. The absorption layer preferably absorbs radiation in the EUV wavelength ranges projected onto the mask 100. The absorption layer may include zirconium (Zr), molybdenum (Mo), ruthenium (Ru), chromium (Cr), chromium oxide ($Cr_2O_3$), titanium nitride (TiN), tantalum nitride (TaN), tantalum (Ta), titanium (Ti), or aluminum-copper (Al—Cu). The absorption layer may be any suitable thickness for a given material to achieve an adequate absorption.

In some embodiments, an antireflection (ARC) layer is deposited above the absorption layer. The ARC layer is configured to reduce a reflection of a radiation having a wavelength shorter than the DUV range from the absorption layer for a DUV inspector. The ARC layer may use compound materials such as TaBO, $Cr_2O_3$, ITO, $SiO_2$, SiN, $TaO_5$, or any suitable material.

In some embodiments, a buffer layer is formed on the capping layer as an etch stop layer for pattering the absorption layer and a sacrificial layer during a subsequent defect repair process. The buffer layer may include silicon dioxide ($SiO_2$), silicon oxynitride (SiON) or other suitable materials.

The above description is intended to be illustrative and is not intended to limit the embodiments, as the pattern layer 103 on the substrate 102 may be designed to have particular characters so that the radiation penetrating through or reflecting from the mask 100 can irradiate on desired locations of the semiconductor wafer with desired radiation energy.

Still referring to FIG. 2A, the pellicle 104 further includes an optical member 110 disposed in the membrane 106. The optical member 110 is configured to locally adjust the pattern projected onto the semiconductor wafer.

In some embodiments, the optical member 110 includes a surface 110b coplanar with the surface 106b of the membrane 106. In some embodiments, the optical member 110 includes a surface 110a non-coplanar with the surface 106a of the membrane 106. In some embodiments, the non-coplanar surface 110a protrudes from the surface 106a of the membrane 106.

In some embodiments, the non-coplanar surface 110a has an arc shape. In some embodiments, the optical member 110 is a convex lens. In some embodiments, the optical member 110 is a plano-convex lens.

In some embodiments, the optical member 110 comprises a same material as the membrane 106, such as silicon, poly-silicon or other suitable material. In some embodiments, the optical member 110 comprises a material different from the membrane 106. The material of the optical member 110 can be selected such that the propagation direction of the radiation penetrating through the optical member 110 can be changed, therefore the pattern projected onto the semiconductor wafer can be locally adjusted as desired. In some embodiments, the optical member 110 has a refractive index different from the membrane 106. In some embodiments, the propagation direction of the radiation penetrating through the optical member 110 is changed due to the refractive index difference. Referring to FIG. 2B, the mask 100 of FIG. 2B may have structures and features similar to the mask 100 of FIG. 2A and the description is not repeated herein. The pellicle 104 further includes an optical member 112 disposed in the membrane 106.

In some embodiments, the optical member 112 includes a surface 112b coplanar with the surface 106b of the membrane 106. In some embodiments, the optical member 110 includes a surface 112a non-coplanar with the surface 106a of the membrane 106. In some embodiments, the non-coplanar surface 112a recesses from the surface 106a of the membrane 106.

In some embodiments, the non-coplanar surface 112a has an arc shape. In some embodiments, the optical member 112 is a concave lens. In some embodiments, the optical member 110 is a plano-concave lens.

While only one optical member and its related structure are illustrated in FIGS. 2A and 2B for simplicity of explanation, this is intended to be illustrative only, and is not intended to be limiting to the embodiments. Rather, any suitable number of optical members may alternatively be utilized, and all such combinations are fully intended to be included within the scope of the embodiments. For example, two optical members are included in the mask 100 of FIG. 2C. Besides, the multiple optical members may have different structures and/or may locate at different positions. For example, multiple concave and convex lenses may be formed in different positions of the pellicle 104.

Referring to FIG. 3 to FIG. 6, FIG. 3 to FIG. 6 illustrates a photolithography operation applying the mask 100 in accordance with some embodiments of the present disclosure.

As shown in FIG. 3 to FIG. 6, a wafer 300 with a radiation light sensitive coating layer 302 is provided. The wafer 300 undergoes a photolithography operation in an apparatus including the mask 100.

The wafer 300 may be positioned on the substrate stage (not shown) under the mask 100. The wafer 300 is positioned to receive the radiation transmitted through or reflected off the mask 100. The image on the wafer 300 corresponds to the pattern on the mask 100. The image is utilized on the wafer 300 to pattern the radiation light sensitive coating layer 302. The radiation light sensitive coating layer 302 can be utilized to define doping regions, deposition regions, etching regions, or other structures associated with an integrated circuit (IC). In some embodiments, the radiation light sensitive coating layer 302 may include a positive tone resist or a negative tone resist.

In some embodiments, the apparatus may include a radiation source 304 and a lens system 306. However, other configurations and inclusion or omission of devices may be possible.

In some embodiments, the radiation source 304 may be a UV, DUV or EUV radiation source. For example, the radiation source 304 may be a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; EUV radiation source with a wavelength of 13.5 nm; or other light sources having a desired wavelength. The EUV radiation source may be excited by a laser beam to generate an EUV beam. In some example embodiments, the EUV radiation source may include at least one of tin (Sn), xenon (Xe), titanium (Ti), or lithium (Li), which may be in a plasma state. The EUV radiation source of tin may generate the EUV beam having a wavelength of about 13.5 nm.

In some embodiments, the lens system 306 may have a single lens or multiple lenses and/or other lens components. For example, the lens system 306 may include microlens arrays, shadow masks, and/or other structures. Each lens element may include a transmissive substrate and may further include a plurality of coating layers. The transmissive substrate may be a conventional objective lens, and may be made of fused silica ($SiO_2$), calcium-fluoride ($CaF_2$), lithium fluoride (LiF), barium fluoride ($BaF_2$), or other suitable material. The materials used for each lens element may be chosen based on the wavelength of radiation used in the photolithography operation to minimize absorption and scattering. In some embodiments, the lens system 306 guides a radiation to the mask 100. In some embodiments, the lens system 306 guides a radiation to the wafer 300 to be processed.

In some embodiments, other configurations and inclusion or omission of the apparatus may be possible. For example, the apparatus may include a chamber (not shown) to provide a vacuum environment or a low pressure environment with inert gas for protecting various components and the wafer 300 to be processed.

Figure 3:
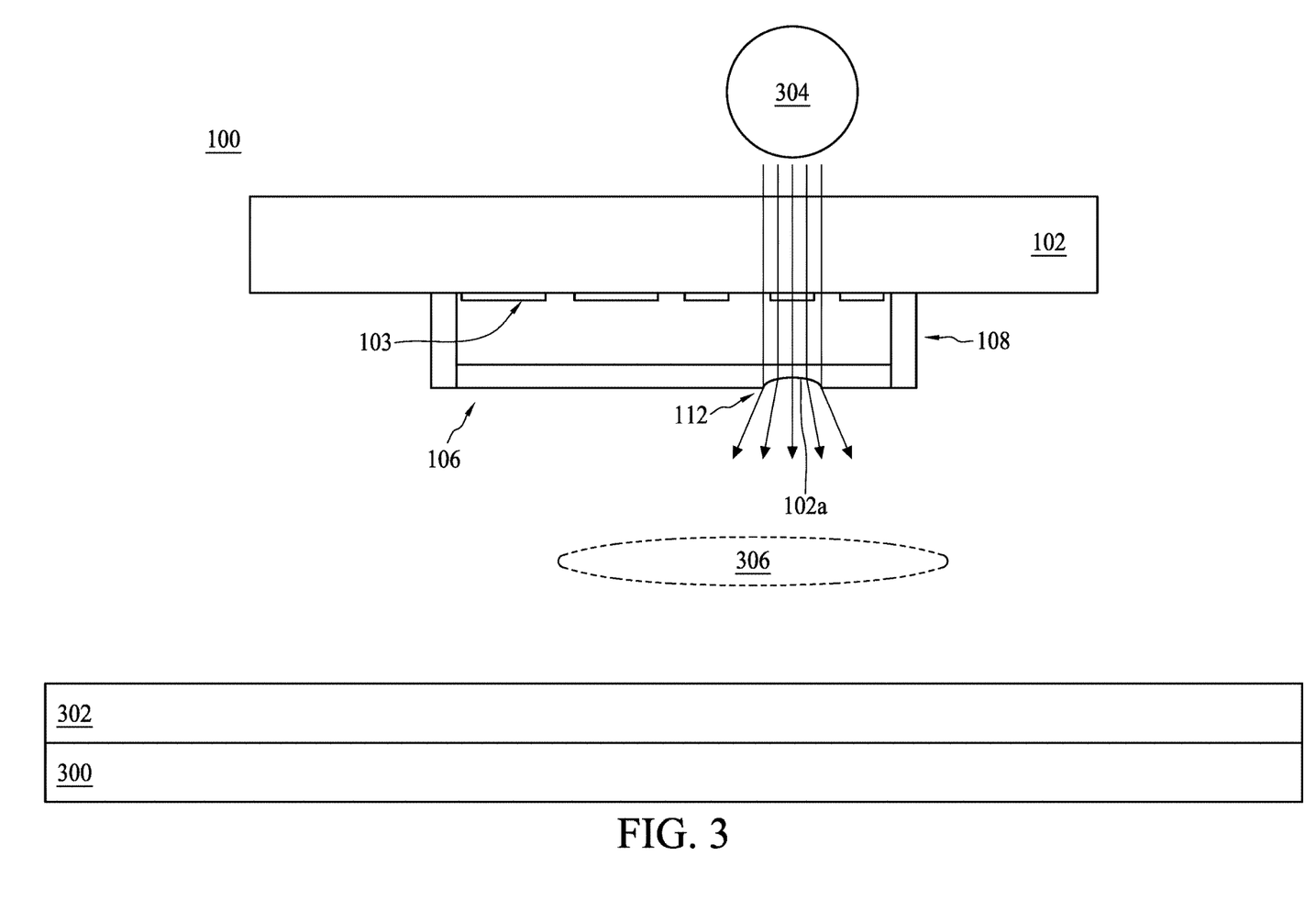
FIG. 3 to FIG. 6 illustrate a photolithography operation applying a mask in accordance with some embodiments of the present disclosure.
Figure 4:
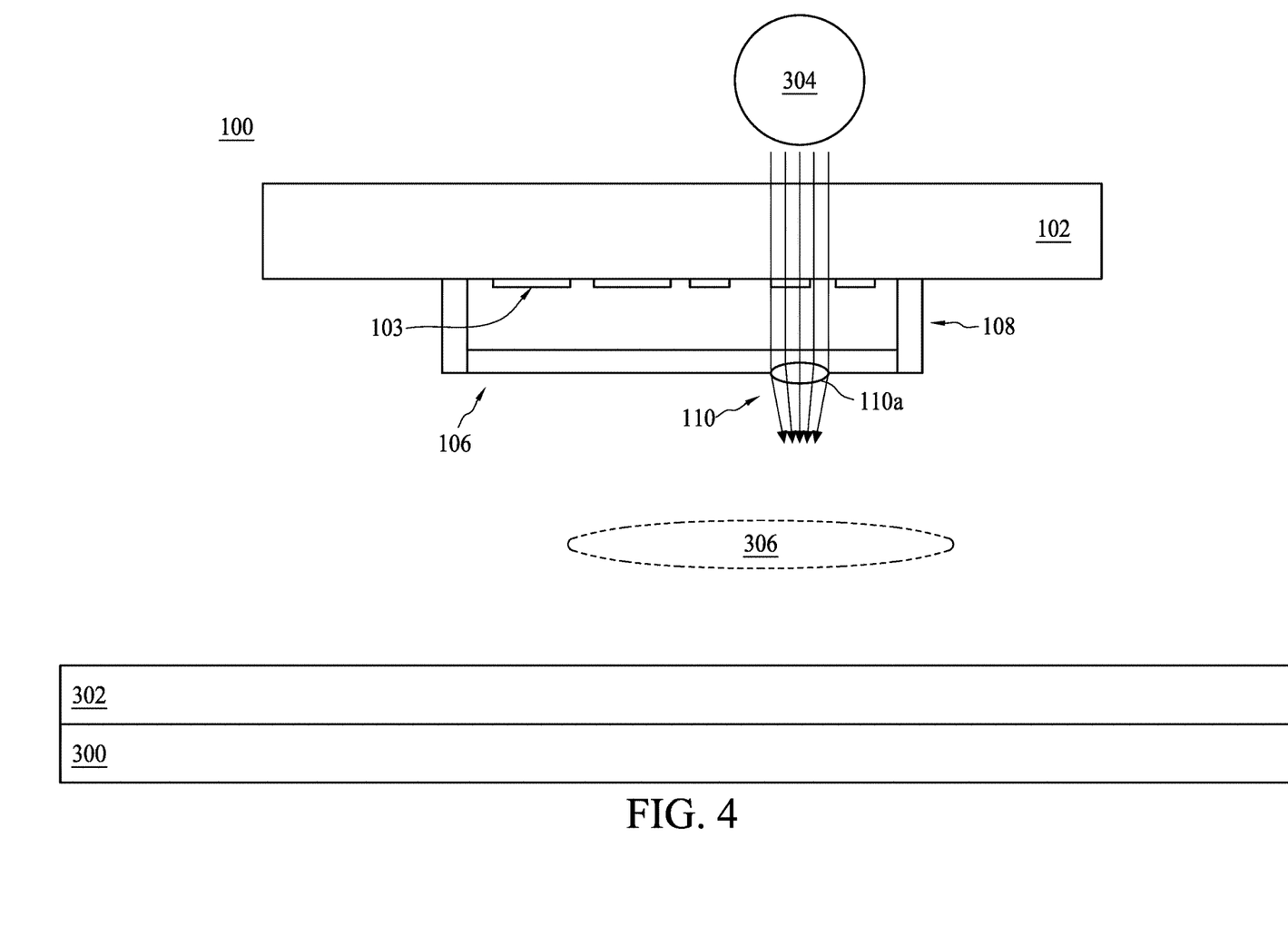

Referring to FIG. 3 and FIG. 4, the substrate 102 and the membrane 106 of the mask 100 are transmissive to a radiation from the radiation source 304. The radiation penetrates through the substrate 102 and the membrane 106 and projects on the radiation light sensitive coating layer 302.

In some embodiments, the optical member 110 or 112 has a light propagating route different from the membrane 106. For example, the light in the optical member 110 or 112 propagates in a different route from the light in the other portion of the membrane 106. When the radiation come into the optical member 110 or 112, the propagation direction thereof is changed. For example, in FIG. 3, the radiation diverges after penetrating through the optical member 112. In some embodiments, the non-coplanar surface 112a of the optical member 112 faces against the radiation source 304.

In some embodiments, the radiation diverging from the optical member 112 is collected by the lens system 306. The lens system 306 directs the patterned radiation to the wafer 300. The wafer 300 includes the radiation light sensitive coating layer 302, which is sensitive to the radiation used in the photolithography operation.

In some embodiments, the radiation converges after penetrating through the optical member 110 as shown in FIG. 4. In some embodiments, the non-coplanar surface 110a of the optical member 110 faces against the radiation source 304.

Figure 5:
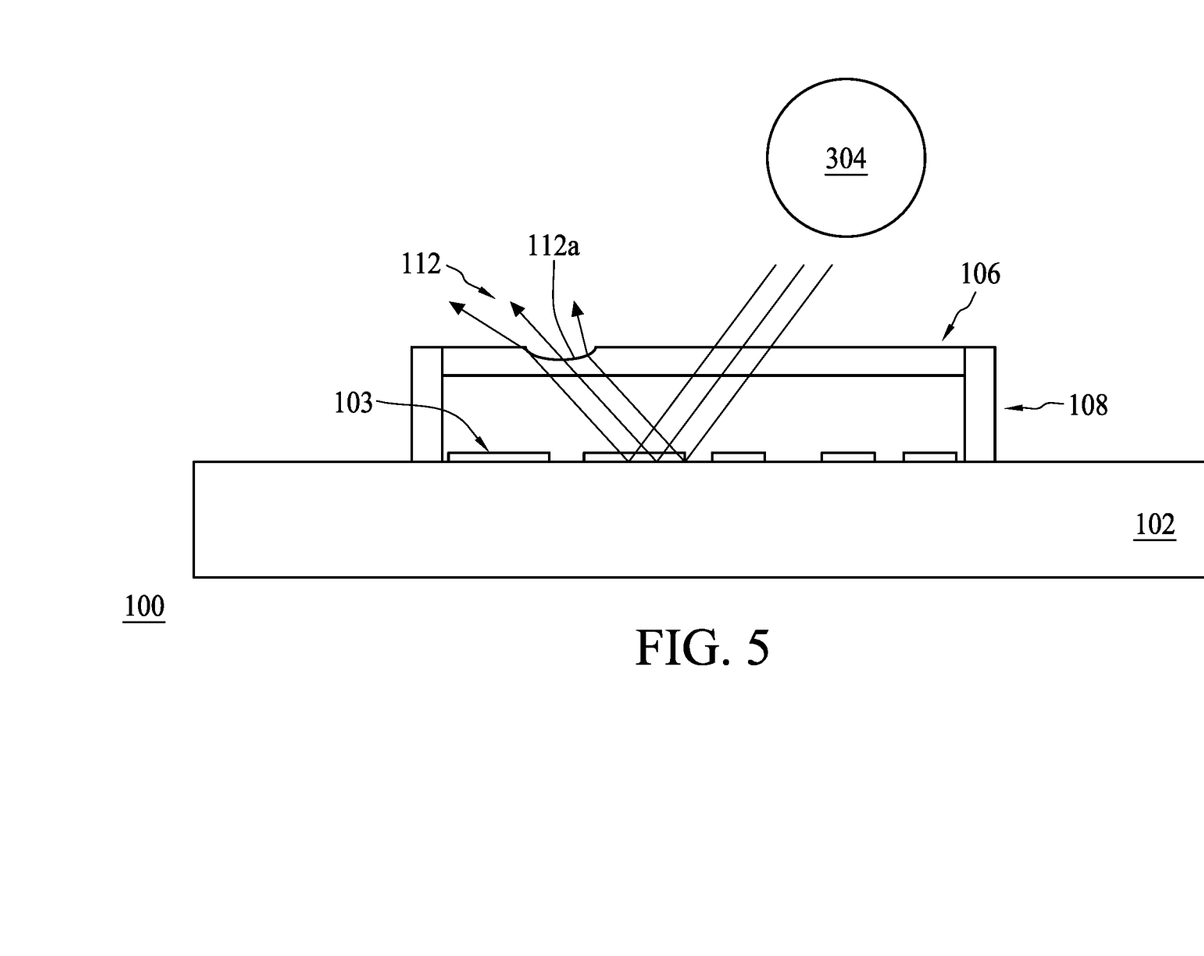
Figure 6:
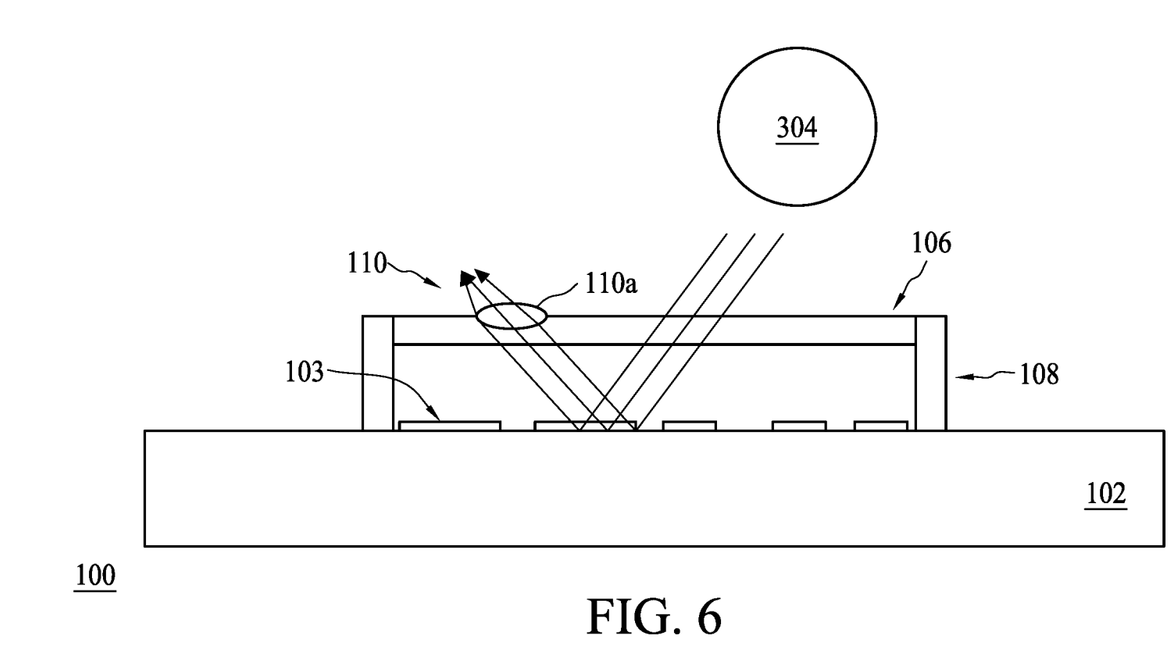

Referring to FIG. 5 and FIG. 6, in some embodiments, the substrate 102 of the mask 100 is reflective to a radiation from the radiation source 304. In some embodiments, the radiation source 304 provides radiation having a wavelength in the EUV range. The radiation reflected from the substrate 102 may change its propagation direction after penetrating through the optical member 112. For example, the radiation diverges after penetrating through the optical member 112 as shown in FIG. 5. Alternatively, the radiation converges after penetrating through the optical member 110 as shown in FIG. 6.

In some embodiments, the non-coplanar surface 112a of the optical member 112 faces toward the radiation source 304, as shown in FIG. 5. In some embodiments, the non-coplanar surface 110a of the optical member 110 faces toward the radiation source 304, as shown in FIG. 6.

Figure 7:
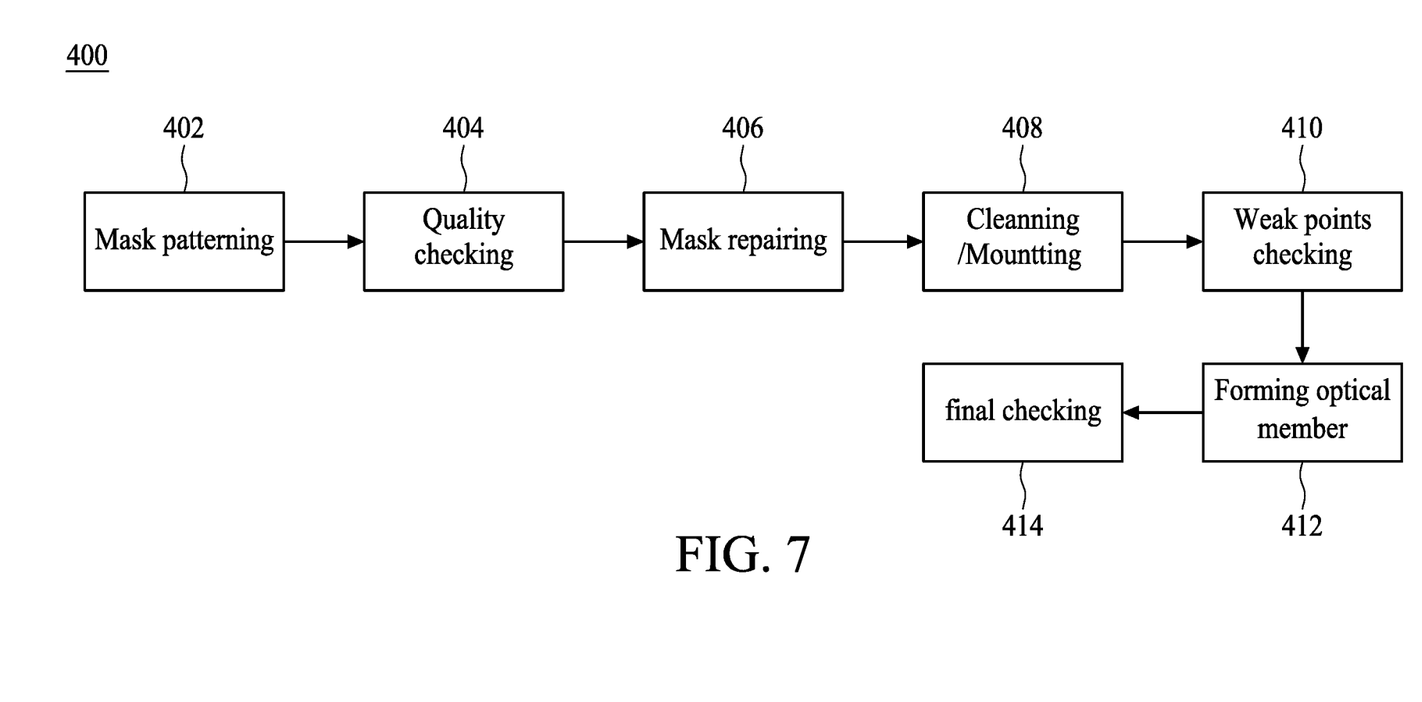
FIG. 7 is a flowchart illustrating a method for manufacturing a mask in accordance with some embodiments of the present disclosure.

Referring to FIG. 2C and FIG. 7, FIG. 7 is a flowchart illustrating a method 400 for manufacturing the mask 100 in accordance with some embodiments of the present disclosure.

In step 402, a substrate 102 is provided, and a pattern layer 103 is formed on the substrate 102. As mentioned above, the pattern layer 103 may include multiple layers such as a reflective multilayer, a capping layer, an absorption layer, an antireflection (ARC) layer, and/or a buffer layer.

The one or more layers on the substrate 102 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, and/or other methods known in the art.

Then, the one or more layers on the substrate 102 are patterned to form the substrate 102 having a predetermined layout pattern. In some embodiments, the predetermined layout pattern includes various geometrical features designed for an IC product and based on a specification of the IC product. In some embodiments, the predetermined layout pattern may be formed by an electron beam writer.

In step 404, the substrate 102 may undergo a quality check operation by a mask defect inspection system. The mask defect inspection system includes a suitable system for detecting defects in a mask. The mask defect inspection system aims to identify mask defects for mask repair and enhance mask fabrication yield.

In some embodiments, the quality check operation includes inspecting patterns on the substrate 102 against the IC design layout pattern by a photomask inspection tool. In some embodiments, the quality check operation may be practiced through photolithography simulation and measurement of critical dimensions. For example, the quality check operation includes converting the predetermined layout pattern into a rendered mask pattern through an inverse image rendering process. Then, a photolithography operation may be simulated using the rendered mask pattern to create a virtual wafer pattern. Finally, based on the virtual wafer pattern, defects in the mask can be determined.

In step 406, the substrate 102 may undergo a defect repair operation by a repair system. The mask repair system is a suitable system, such as an e-beam repair system and/or a focused ion beam (FIB) repair system. In some embodiments, the defect repair operation can be omitted to avoid any damage to the substrate 102, and the defects found in step 404 can be fixed latter in step 412.

In step 408, the substrate 102 can then undergo a cleaning operation and a pellicle mounting operation.

A cleaning operation typically includes placing the substrate 102 in an environment of pure nitrogen or extreme clean dry air (XCDA). Both of these environments can remove moisture and ammonia reactants from the substrate 102.

A pellicle mounting operation typically includes mounting the pellicle 104 to the substrate 102 by attaching the membrane 106 of the pellicle 104 to the substrate 102 through the frame 108. In some embodiments, an adhesive is utilized to mount the pellicle 104. However, any suitable process to clean the substrate 102 and mount the pellicle may be used.

In step 410, detect a weak point of the mask 100. For example, detect location that is likely to fail in the pattern projected onto the semiconductor wafer. In some embodiments, the system and/or method adopted in step 404 can also be utilized in step 410.

In step 412, form the optical member 110 and/or optical member 112 disposed in the membrane 106. In some embodiments, forming the optical member includes forming a refractive surface on the membrane 106 to fix photolithography behavior of the weak point.

In some embodiments, the optical member 110 and/or optical member 112 can be formed while the membrane 106 is attached on the frame 108.

In some embodiments, a recess is formed by etching a portion of the membrane 106. In some embodiments, in-situ plasma etches method or other etching processes well known in the art can be utilized. For example, the recess may be formed by forming a mask pattern on the membrane 106, and performing a wet etching process on the membrane 106 exposed by the mask pattern. In some embodiments, a concave refractive surface is formed by etching a portion of the membrane 106.

In some embodiments, a protrusion is formed by depositing a material on the membrane 106. For example, the protrusion is formed by ion beam deposition, atomic layer deposition (ALD), and/or other methods known in the art. In some embodiments, the material same as the membrane 106 can be deposited on the membrane 106, such silicon, polysilicon, amorphous silicon, or other suitable material. In some embodiments, a material different from the membrane 106 may be deposited. In some embodiments, a convex refractive surface is formed by depositing a material on the membrane 106.

In step 414, the substrate 102 may undergo a final check operation before used in the photolithography operation to make sure that the substrate 102 can provide a pattern onto the radiation light sensitive coating layer 302 up to a certain tolerance.

Some embodiments of the present disclosure provide a mask for photolithography patterning. The mask includes a substrate, a pattern layer on a surface of the substrate. The mask also includes a pellicle attached to the substrate and configured to isolate the pattern layer from ambient. The pellicle includes a membrane between the pattern layer and ambient, and an optical member disposed in the membrane.

Some embodiments of the present disclosure provide a pellicle for a photolithographic mask. The pellicle includes a membrane and an optical member. The membrane is configured to isolate a pattern layer of the photolithographic mask from ambient. The optical member is disposed in the membrane. The optical member comprises a light propagating route different from the membrane.

Some embodiments of the present disclosure provide a method for manufacturing a mask. The method includes: providing a substrate with a pattern layer, mounting a pellicle with a membrane on the substrate, and forming an optical member in the membrane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A mask for photolithography patterning, comprising:
a substrate;
a pattern layer on a surface of the substrate; and
a pellicle attached to the substrate and configured to isolate the pattern layer from ambient,
wherein the pellicle includes a membrane between the pattern layer and ambient, and an optical member disposed in the membrane.

2. The mask of claim 1, wherein the optical member comprises a surface coplanar with a surface of the membrane which faces toward the pattern layer.

3. The mask of claim 1, wherein the optical member comprises a surface non-coplanar with a surface of the membrane which faces against the pattern layer.

4. The mask of claim 3, wherein the non-coplanar surface protrudes from the surface of the membrane.

5. The mask of claim 3, wherein the non-coplanar surface recesses in the surface of the membrane.

6. The mask of claim 3, wherein the non-coplanar surface faces toward a radiation source.

7. The mask of claim 3, wherein the non-coplanar surface faces against a radiation source.

8. The mask of claim 1, wherein the membrane comprises silicon.

9. The mask of claim 1, wherein the optical member comprises a refractive index different from the membrane.

10. A pellicle for a photolithographic mask, comprising:
a membrane configured to isolate a pattern layer of the photolithographic mask from ambient; and
an optical member disposed in the membrane, wherein the optical member comprises a light propagating route different from the membrane.

11. The pellicle of claim 10, wherein the optical member comprises a surface coplanar with a surface of the membrane which faces toward the pattern layer.

12. The pellicle of claim 10, wherein the optical member comprises a surface non-coplanar with a surface of the membrane which faces against the pattern layer.

13. The pellicle of claim 12, wherein the non-coplanar surface protrudes from the surface of the membrane.

14. The pellicle of claim 12, wherein the non-coplanar surface recesses in the surface of the membrane.

15. The pellicle of claim 10, wherein the membrane comprises silicon.

16. The pellicle of claim 10, wherein the optical member comprises a refractive index different from the membrane.

17. A method for manufacturing a mask, comprising:
providing a substrate with a pattern layer;
mounting a pellicle with a membrane on the substrate; and
forming an optical member in the membrane.

18. The method of claim 17, further comprising:
detecting a weak point of the mask; and
forming a refractive surface on the membrane to fix photolithography behavior of the weak point.

19. The method of claim 18, wherein forming the refractive surface comprises:
forming a recess by etching a portion of the membrane.

20. The method of claim 18, wherein forming the refractive surface comprises:
forming a protrusion by depositing a material on the membrane.

* * * * *